United States Patent [19]
Menegoli

[11] Patent Number: 6,133,107
[45] Date of Patent: Oct. 17, 2000

[54] PROCESS FOR CO-INTEGRATING DMOS TRANSISTORS WITH SCHOTTKY DIODE BODY STRUCTURE

[75] Inventor: Paolo Menegoli, Milpitas, Calif.

[73] Assignee: STMicroelectronics, Inc., Carrollton, Tex.

[21] Appl. No.: 09/243,017

[22] Filed: Feb. 3, 1999

Related U.S. Application Data

[62] Division of application No. 08/825,139, Mar. 28, 1997, Pat. No. 5,925,910.

[51] Int. Cl.[7] .................................................. H01L 21/336
[52] U.S. Cl. ........................ 438/306; 438/268; 438/138; 438/237; 438/571
[58] Field of Search .................................. 438/306, 268, 438/269, 273, 274, 138, 237, 238, 570, 571, 381; 148/DIG. 139, DIG. 140

[56] References Cited

U.S. PATENT DOCUMENTS

| | | | |
|---|---|---|---|
| 4,300,150 | 11/1981 | Colak | 357/23 |
| 4,618,872 | 10/1986 | Baliga | 307/577 |
| 4,811,065 | 3/1989 | Cogan | 357/23.4 |
| 4,914,051 | 4/1990 | Huie et al. | 438/269 |
| 4,979,001 | 12/1990 | Alter | 257/379 |
| 4,989,058 | 1/1991 | Colak et al. | 357/23.8 |
| 5,061,981 | 10/1991 | Hall | 357/42 |
| 5,164,802 | 11/1992 | Jones et al. | 257/337 |
| 5,369,045 | 11/1994 | Ng et al. | 148/DIG. 126 |
| 5,642,295 | 6/1997 | Smayling | 257/321 |
| 5,915,179 | 6/1999 | Etou et al. | 438/268 |

FOREIGN PATENT DOCUMENTS 0747 969 A1  12/1996  European Pat. Off. .

*Primary Examiner*—Michael Trinh
*Attorney, Agent, or Firm*—David V. Carlson; Theodore E. Galanthay; Lisa K. Jorgenson

[57] ABSTRACT

A DMOS device in a complex integrated circuit having a well region defined by a buried isolation region and an overlapping deep drain region within an epitaxial layer formed over a substrate, a body region having two source regions within the well region, insulated gates over the two source regions, and a Schottky contact over a central portion of the well region and spaced from the body region. The Schottky contact defines a Schottky diode within the epitaxial layer for diverting current from the substrate in the event of a below ground effect or an oversupply effect. The invention reduces or eliminates altogether the effects of parasitic transistors in the complex integrated circuit.

14 Claims, 12 Drawing Sheets

PROCESS FOR CO-INTEGRATING DMOS TRANSISTORS WITH SCHOTTKY DIODE BODY STRUCTURE

CROSS-REFERENCE TO RELATED APPLICATIONS

This application is a divisional of U.S. patent application Ser. No. 08/825,139, filed on Mar. 28, 1997, U.S. Pat. No. 5,925,910.

TECHNICAL FIELD

This invention relates to power MOS (DMOS) transistors, and more particularly, to a Schottky diode incorporated in parallel with an intrinsic body diode of a DMOS transistor to reduce parasitic effects.

BACKGROUND OF THE INVENTION

Power MOS transistors, also called DMOS transistors, are commonly used to drive inductive loads such as solenoids or DC motors. A DMOS transistor can transfer peak currents of up to 280 amps or continuous currents of up to 70 amps to an inductive load. The DMOS transistor may operate at voltages as high as 1,000 volts with a resistance as low as 0.02 ohms. The DMOS transistor is also not susceptible to thermal runaway or secondary breakdown problems.

DMOS transistors are typically fabricated in an IC chip which is connected to control the inductive load. The semiconductor structure of the DMOS transistor gives rise to parasitic effects which, under the appropriate conditions, may degrade the performance of the transistor. Specifically, body diodes, parasitic bipolar junction transistors (BJTs) and capacitances influence the operation of the DMOS transistor.

The parasitic effects may be illustrated with reference to a conventional H-bridge circuit shown in FIG. 1. An inductive load L is powered by four N-channel DMOS transistors, M1, M2, M3, and M4. A drain of the transistor M2 and a drain of the transistor M3 are connected to a voltage source Vcc. A source of the transistor M4 and a source of the transistor M1 are connected to a ground voltage reference. A source of the transistor M2 and a drain of the transistor M4 are connected to a first end of the inductive load L, and a source of the transistor M3 and a drain of the transistor M1 are connected to a second end of the inductive load L. Each of the DMOS transistors is shown with a respective body diode Db1, Db2, Db3, and Db4 connected between the source and the drain. The body diode is intrinsic to the structure of the DMOS transistor. Parasitic transistors QP and QP2 are also shown.

The four DMOS transistors of the H-bridge circuit control the delivery of current to the inductive load L. The DMOS transistors are alternately switched on and off to permit current to flow from the voltage source Vcc to the ground voltage reference. For example, when the transistors M1 and M2 are switched on and the transistors M3 and M4 are switched off, current will flow from the voltage source Vcc, through the transistor M2, the inductive load L, and the transistor M1 to the ground voltage reference. If the transistors M3 and M4 are switched on, and the transistors M1 and M2 are switched off, current will flow from the voltage source Vcc through the transistor M3, the inductive load L, and the transistor M4 to the ground voltage reference.

When the DMOS transistors switch on or off to change the direction of current in the inductive load L, the inductive load L will react by applying a transient voltage to oppose the changing current. The transient voltage will often activate the parasitic devices in the DMOS transistor. For example, with reference to FIG. 1, if the transistors M3 and M4 are conducting current through the inductive load L and are switched off, the inductive load L will react to maintain the current. Specifically, the drain of the transistor M1 will be driven below the ground voltage reference to draw current through the transistor M1, and the source of the transistor M2 will be driven above the voltage source Vcc to force current through the transistor M2. The parasitic effects may be demonstrated by examining the structure of the DMOS transistor.

A cross-sectional view of a conventional N-channel DMOS transistor 8 of the type used for the transistors M1–M4 is shown in FIG. 2. It has gate G, source S, and drain D, terminals as shown as well as a parasitic PNP transistor QP2 and a body diode Db. The structure of DMOS transistor 8 may be provided by a method known to those skilled in the art.

The body diode Db is comprised of a $P^+$ type body region 10 and an N type epi pocket 12. The body diode Db is intrinsic to the structure of the DMOS transistor 8 and has a turn-on threshold voltage and a series resistance. The parasitic PNP transistor QP2 is comprised of the $P^+$ body region 10 acting as an emitter, an $N^+$ type drain region 14 and the epi pocket 12 acting as a base, and a $P^-$ type substrate 16 acting as a collector. A finite resistance in the $P^-$ substrate 16 is represented by a resistor Rsub. A $P^+$ type region 18 links the $P^-$ substrate 16 with a ground voltage reference at a surface of the $P^-$ substrate 16. A second N type epi pocket 20 is shown in the $P^-$ substrate 16 to support a separate device.

The known DMOS transistor 8 operates as follows. When a voltage at the drain terminal D exceeds a voltage at the source terminal S, and a positive voltage is applied to the gate terminal G which exceeds a threshold voltage of the DMOS transistor 8, current flows from the drain terminal D and the $N^+$ drain region 14 to two $N^+$ type source regions 22 and 24 through N type channels induced in the $P^+$ body region 10. When the voltage applied to the gate terminal G falls below the threshold voltage, the transistor is turned off and current through the DMOS transistor 8 stops.

The body diode Db and the parasitic PNP transistor QP2 may be activated when a voltage applied to the source terminal S of the DMOS transistor 8 exceeds a voltage at the drain terminal D of the DMOS transistor 8. This is called an oversupply effect. If the voltage at the source is sufficiently high, the body diode Db will be forward biased, and a recirculation current will flow from the source terminal S, through the $P^+$ body region 10, the epi pocket 12, and the $N^+$ drain region 14 to the drain terminal D. When the parasitic PNP transistor QP2 is activated, a portion of the current from the source terminal S will flow through the emitter, the base, and into the $P^-$ substrate 16 acting as the collector of the transistor QP2.

The efficiency of the transistor QP2 may be reduced by surrounding the DMOS transistor 8 with an $N^+$ type region which, together with a buried $N^+$ type layer, will act as a highly doped base so that only a small fraction of the current from the source terminal S (usually 3 to 4%) may reach the $P^-$ substrate 16. The current into the $P^-$ substrate 16 raises the potential of the substrate because it has a finite resistance Rsub. The epi pockets 12 and 20 have a voltage close to the voltage of the $P^-$ substrate 16 which enhances the effect of this current. A rising potential in the $P^-$ substrate 16 may forward bias junctions between the $P^-$ substrate 16 and the epi pockets 12 and 20, and consequently inject current into the epi pockets 12 and 20. Such current injection is highly undesirable. A conventional method of alleviating the effect is to connect the P⁻ substrate 16 to a ground reference potential. However, this solution exacerbates another parasitic effect known as the below ground effect.

The below ground effect is described with reference to a cross-sectional view of the conventional N-channel DMOS transistor 8 shown in FIG. 3. The structure of the DMOS transistor 8 is identical to that of the DMOS transistor 8 shown in FIG. 2, and equivalent regions and elements have been given the same reference numerals. In addition to the regions and elements shown in FIG. 2, two N type epi pockets 26 and 28 support other devices located near the DMOS transistor 8 in the P⁻ substrate 16. Each of the epi pockets 20, 26, and 28 receive a device current IcP. A parasitic, bulk distributed NPN transistor QP is shown having the epi pocket 12 and the N⁺ drain region 14 acting as an emitter, the P⁻ substrate 16 and the P⁺ region 18 acting as a base, and each of the epi pockets 20, 26, and 28 acting as collectors for the transistor QP.

When the source terminal S of the DMOS transistor 8 is connected to the ground voltage reference and a voltage is applied to the drain terminal D sufficiently below the ground voltage reference, the below ground effect occurs. First, the body diode Db becomes forward biased and allows a recirculation current to pass from the source terminal S and the P⁺ body region 10 to the N⁺ drain region 14 and the drain terminal D. Second, the transistor QP is activated. The base emitter junction of the transistor QP will become forward biased in this instance because the base of the transistor QP is held to the ground voltage reference while the voltage at the emitter is driven below the ground voltage reference. Each of the epi pockets 20, 26, and 28 may deliver some current as collectors to the transistor QP. The recirculation current drawn by the source terminal S of the DMOS transistor 8 is split between the body diode Db and the transistor QP. Typically, the emitter of the transistor QP carries between 10% and 50% of the recirculation current, depending on the relevant efficiencies of the body diode Db and the forward biased base emitter junction of the transistor QP. The split of the recirculation current may be worse if a sense resistor is connected in series with the DMOS transistor 8. In fact, a voltage drop across the sense resistor may make the junction between the P⁺ body region 10 and the N⁺ drain region 14 inefficient with the result that all of the recirculation current may be injected into the P⁻ substrate 16.

If the DMOS transistor 8 is subject to either the oversupply effect or the below ground effect, and sufficient current is drawn through one of the parasitic transistors QP2 or QP, an avalanche breakdown or a secondary breakdown of the respective parasitic transistor may occur which could result in a catastrophic failure of the DMOS transistor 8. When current is drawn through one of the parasitic transistors into the P⁻ substrate 16, and the voltage of the P⁻ substrate 16 is raised due to its resistance Rsub, then there is the potential of a turn-on of an SCR which may lead to a latch condition, which is very dangerous.

Several techniques have been implemented to overcome the effects of the body diode and parasitic bipolar devices within the DMOS structure. In one approach, an external silicon diode is placed in parallel with the DMOS structure, and a low voltage Schottky diode is placed in series with the drain of DMOS structure. The external silicon diode diverts current away from the body diode and the parasitic bipolar devices. However, with this approach, the DMOS structure sacrifices power to the Schottky diode and the external diodes increase the cost of the device. Another method includes completely isolating the device with a well region. Although this method may be fairly effective, it is very expensive and presents the risk of parasitic SCR. A third approach involves a technique for modifying the body diode so that the minority carriers in the P and N regions have a shorter lifetime which decreases the recombination time. However, this modification increases the resistance of the P and N type materials and complicates the fabrication of the DMOS structure.

A fourth method for preventing parasitic effects in an N-channel DMOS transistor is described in U.S. Pat. No. 4,811,065 to Cogan which is incorporated herein by way of reference. Cogan discloses a conventional vertical DMOS transistor having a Schottky diode placed in parallel with the body diode. The Schottky diode is forward biased by a voltage drop which is lower than the voltage drop needed to forward bias the body diode, and therefore the Schottky diode bypasses all current from the source of the DMOS transistor while preventing the body diode from becoming forward biased. The resultant structure increases the operational speed of the DMOS transistor by reducing the storage of minority carriers in the body diode. However, the DMOS structure of Cogan does not account for the effects of parasitic BJTs associated with a power DMOS structure on an integrated circuit having many other transistors on the same substrate.

SUMMARY OF THE INVENTION

According to principles of the present invention, a Schottky diode is formed on the same integrated circuit with a DMOS transistor in parallel with a body diode. The Schottky diode diverts current from the body diode in the event of a below ground effect or an oversupply effect, and thereby prevents an activation of parasitic devices in the structure of the DMOS transistor. A method for fabricating the DMOS transistor according to the principles of the invention is also disclosed.

DETAILED DESCRIPTION OF THE INVENTION

A method for constructing an N channel DMOS transistor according to a first embodiment of the invention is shown in FIGS. 4–16.

Figure 1:
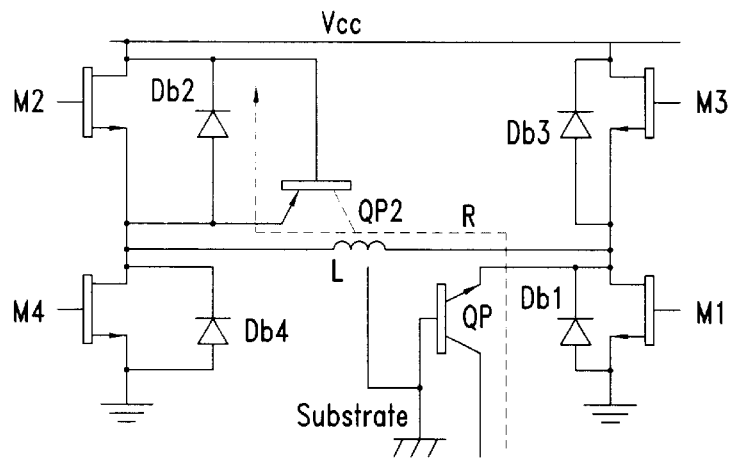
FIG. 1 is an electrical schematic diagram of an H-bridge circuit controlling an inductive load according to the prior art.
Figure 2:
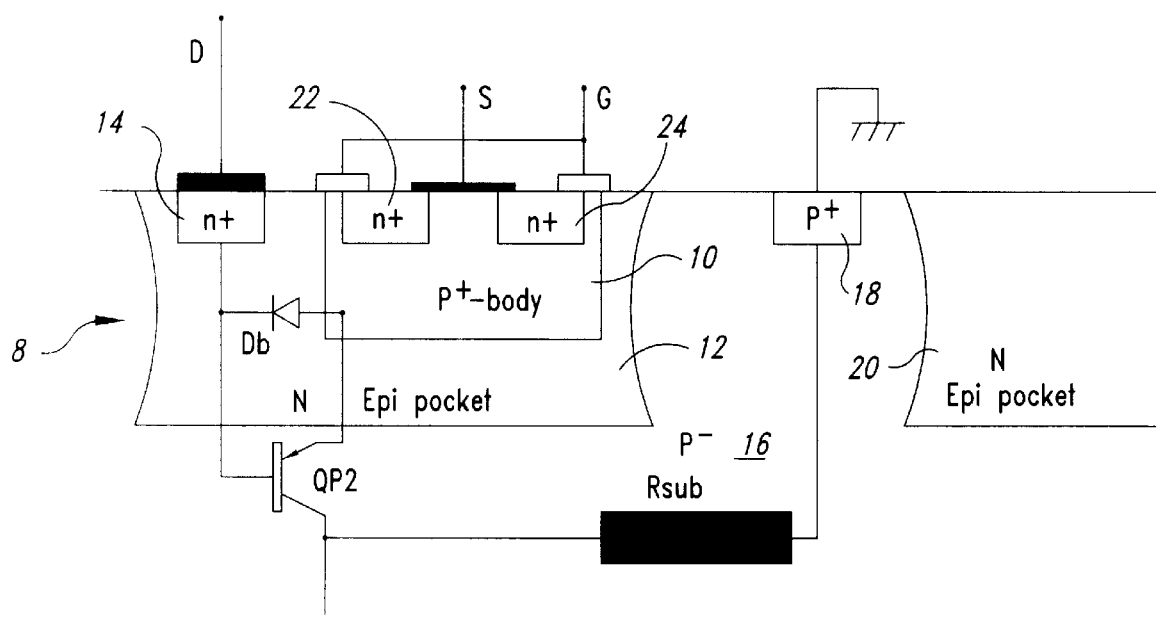
FIG. 2 is a cross-sectional view of an N-channel DMOS transistor in a substrate according to the prior art.
Figure 3:
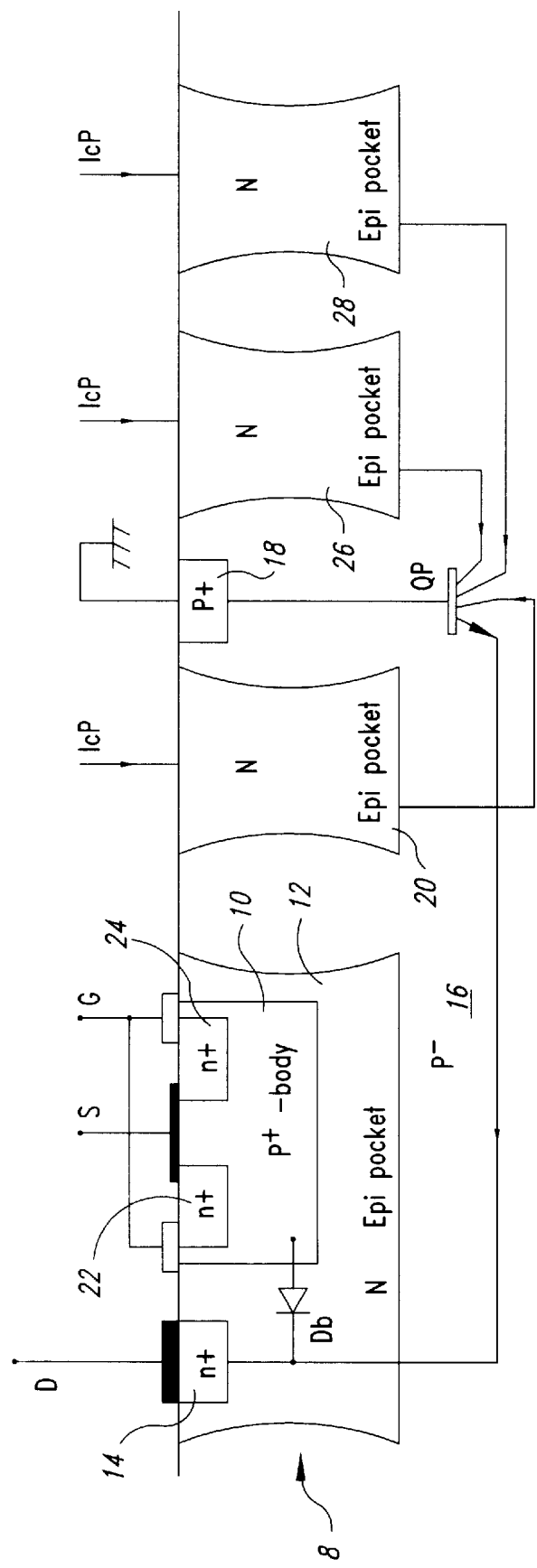
FIG. 3 is a cross-sectional view of an N-channel DMOS transistor in a substrate according to the prior art.
Figure 4:
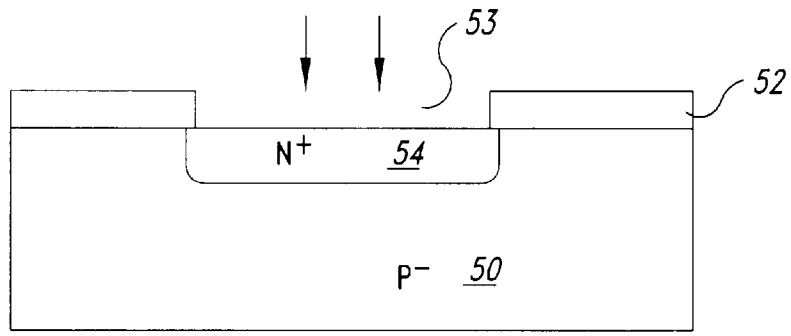
FIGS. 4–16 are cross-sectional views of a process of manufacturing a DMOS transistor according to a first embodiment of the invention.

As shown in FIG. 4, a lightly doped P type silicon substrate 50 is provided having a dopant concentration in the range of 1–2E15 cm$^{-3}$. A mask 52, preferably containing nitride, is formed on the surface of the substrate 50 and is patterned to create a dopant introduction window 53. An N$^+$ type buried region 54 is formed in the substrate 50 through the dopant introduction window 53. The N$^+$ buried region 54 is formed with a conventional ion implantation process using an N type dopant such as arsenic or antimony with an implant energy of 60 KeV resulting in a dopant concentration in the range of 5E19–2E20 cm$^{-3}$. A drive-in step may be used to diffuse the N$^+$ buried region 54 into the substrate 50. After the implant, the substrate is annealed at a temperature between 1150° C. and 1250° C. The mask 52 is then removed.

Figure 5:
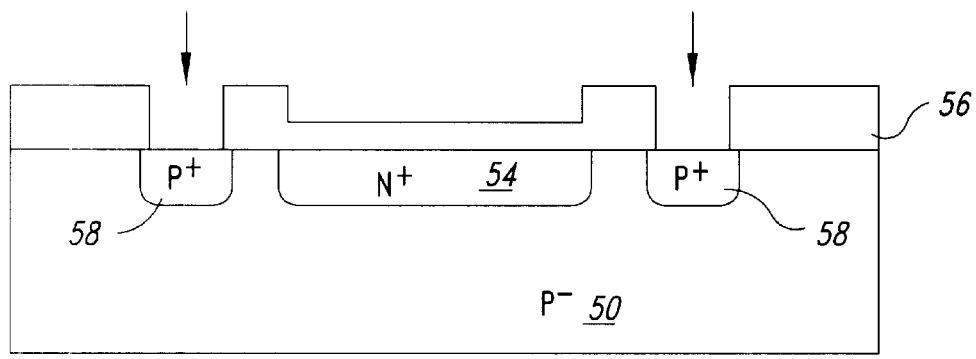

As shown in FIG. 5, a new mask 56 is grown or deposited on the surface of the substrate 50 and is patterned to expose an annular area surrounding the N$^+$ buried region 54. The exposed annular area is implanted with boron ions at an implant energy of 60 KeV to produce a P$^+$ type buried region 58 having a dopant concentration in the range of 2–5E18 cm$^{-3}$. The mask 56 is removed and the substrate 50 is annealed at a temperature between 1000° C. and 1100° C.

Figure 6:
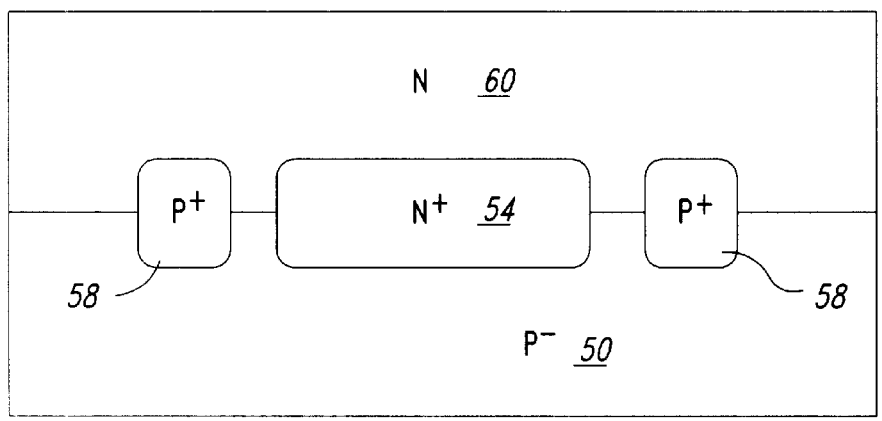

As shown in FIG. 6, an N type epitaxial layer 60 is grown on the substrate 50. The epitaxial layer 60 has a thickness of 2–4 μm and is doped with arsenic or phosphorus ions at 1000° C. to 1100° C. to a dopant concentration in the range of 0.5–2E16 cm$^{-3}$.

Figure 7:
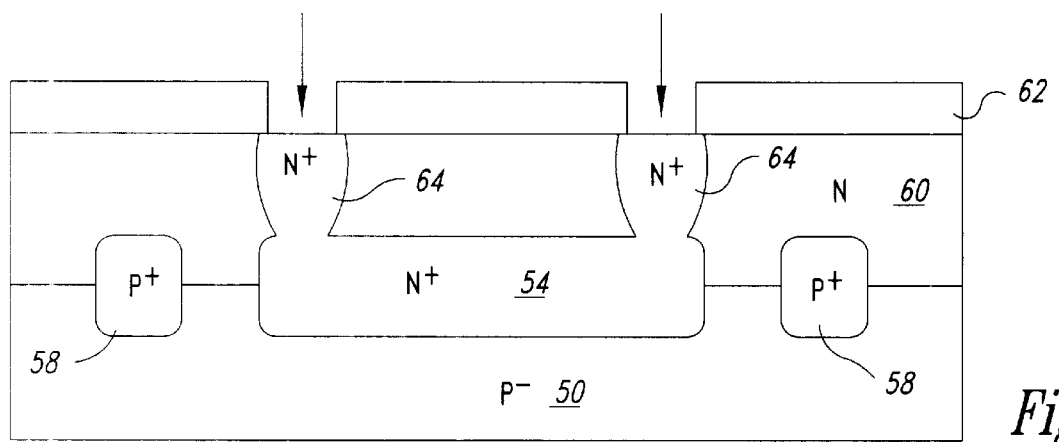
Figure 8:
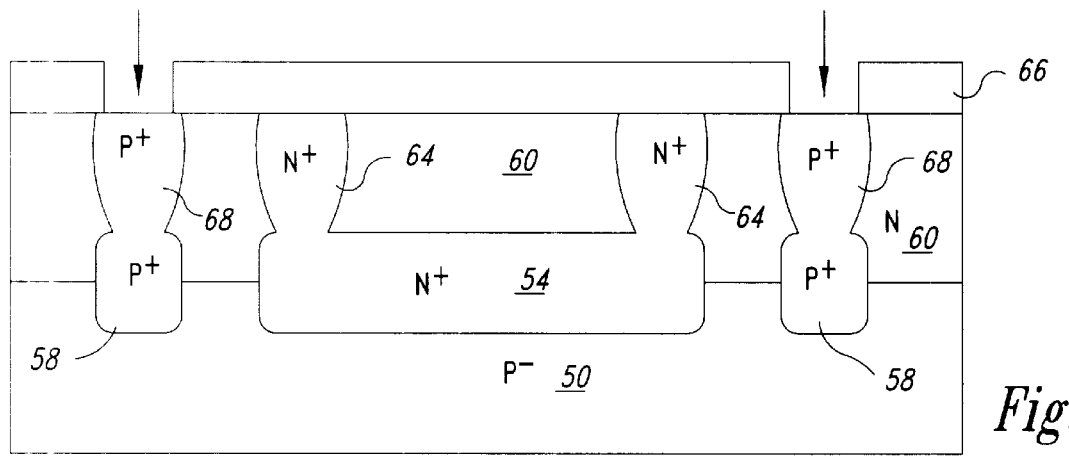

As shown in FIG. 7, a mask 62 is grown or deposited on the surface of the epitaxial layer 60 and is patterned to leave an annular area of the epitaxial layer 60 exposed. An N$^+$ type drain region 64 is then formed by implanting or diffusing phosphorus ions to a concentration in the range of 1–3E20 cm$^{-3}$. A conventional thermal drive-in technique is used to diffuse the N type dopant ions from the surface of the epitaxial layer 60 to peripheral portions of the N$^+$ buried region 54. The mask 62 is removed and the structure is annealed at 1100° C. A mask 66 is grown or deposited on the surface of the epitaxial layer 60 and is patterned to leave an annular area of the surface of the epitaxial layer 60 exposed, shown in FIG. 8. The exposed annular area is implanted with boron ions to form a P$^+$ type region 68 with a dopant concentration in the range of 2E16–2E17 cm$^{-3}$. The P$^+$ region 68 is implanted and then diffused to reach the P$^+$ buried region 58.

Figure 9:
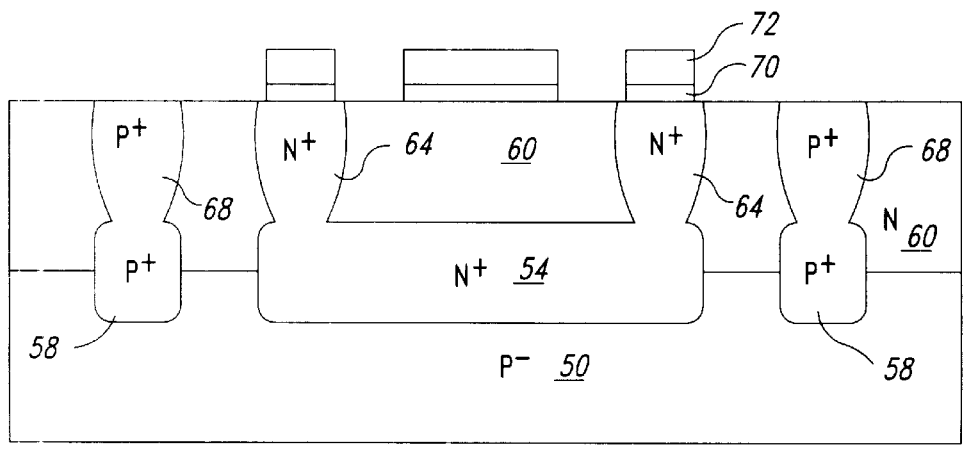

As shown in FIG. 9, a layer of oxide 70 having a thickness of 100 Å to 500 Å is formed on the surface of the epitaxial layer 60 and a nitride film 72, preferably of Si$_3$N$_4$ and having a thickness of 1000 Å to 2000 Å, is deposited by chemical vapor deposition (CVD) processing over the layer of oxide 70. The layer of oxide 70 and the nitride film 72 are patterned to cover an active area over epitaxial layer 60 and an annular area over the N$^+$ drain region 64 leaving the rest of the surface of the epitaxial layer 60 exposed. The exposed area is implanted with boron ions at an implant energy of 20–40 KeV to produce a field implant having a dopant concentration in the range of 5E17–5E18 cm$^{-3}$. A conventional drive-in technique diffuses the boron ions to form a channel stop under the field oxide. The field oxide is then formed using the same mask of FIG. 9 using conventional techniques. A thermal oxidation process is performed at a temperature of between 1000° C. and 1100° C. to produce two field oxide regions 74 and 76 having a maximum thickness of between 7,000 Å and 10,000 Å. The nitride film 72 and the layer of oxide 70 are then removed. The field oxide regions 74 and 76 created by this step are shown in FIG. 10.

Figure 10:
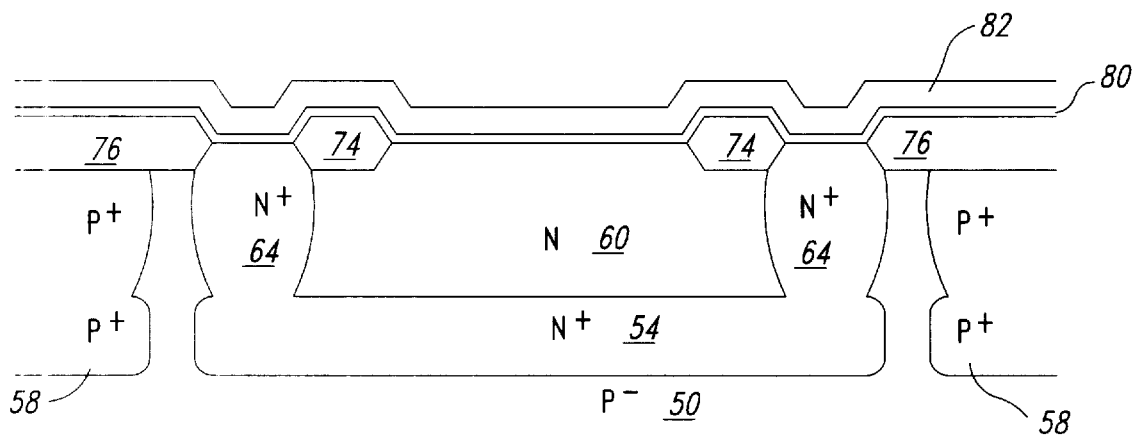

As shown in FIG. 10, a gate oxide layer 80 is grown over the epitaxial layer 60 and a polysilicon layer 82 is deposited on top of the gate oxide layer 80. The gate oxide layer 80 is between 200 Å and 600 Å thick, and the polysilicon layer 82 is between 3,000 Å and 5,000 Å thick. The polysilicon layer 82 is doped through the diffusion of phosphorus ions at a temperature of between 900° C. and 1000° C., resulting in a dopant concentration in the range of 2–3E20 cm$^{-3}$.

Figure 11:
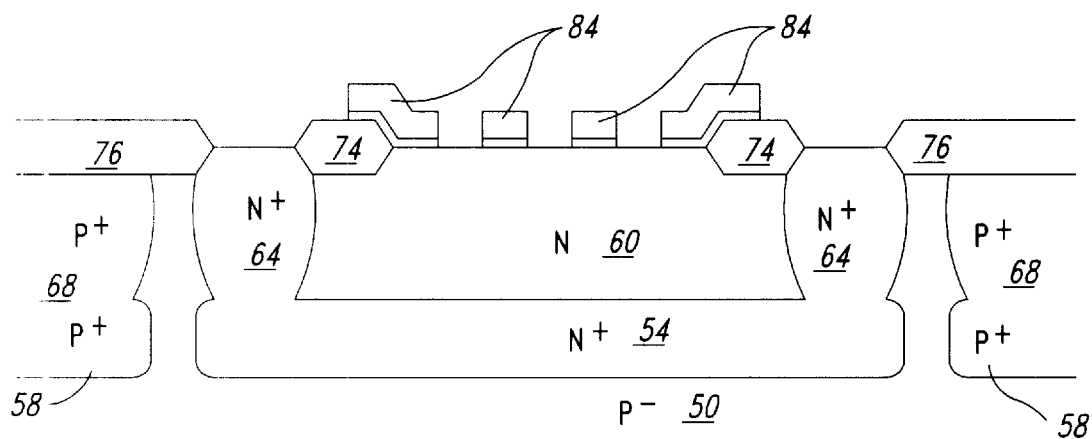

As shown in FIG. 11, a plurality of gate electrodes 84 are formed from a pattern of the gate oxide layer 80 and the polysilicon layer 82.

Figure 12:
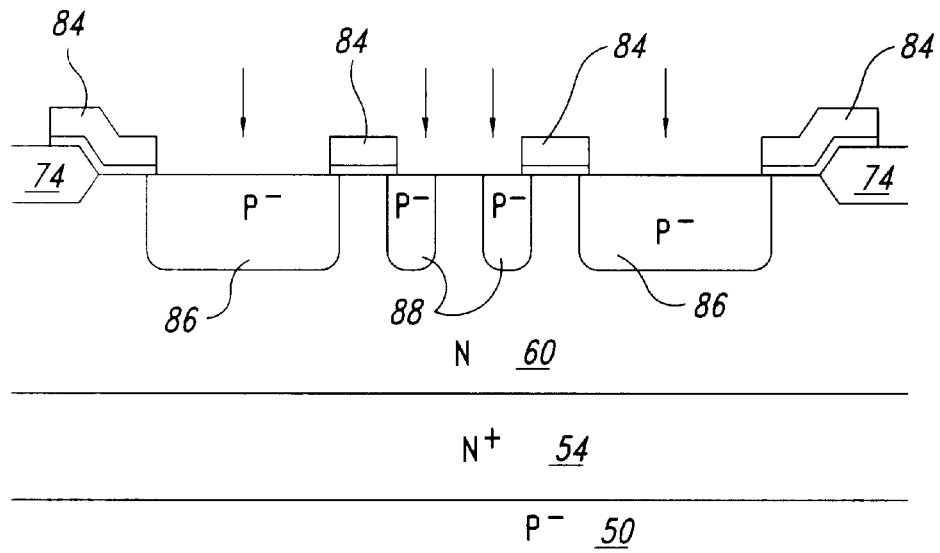

As shown in FIG. 12, at a larger scale than prior figures, a patterned mask (not shown) is grown or deposited over the areas exposed between the gate electrodes 84 and an area of the epitaxial layer 60 is implanted with boron ions at an implant energy of 20–40 KeV. A P$^-$ type body region 86 and a P$^-$ type ring region 88 are formed having dopant concentrations in the range of 5E17–2E18 cm$^{-3}$. The P$^-$ body region 86 and P$^-$ ring region 88 are each self-aligned to the respective gate electrodes 84. This ensures accurate placement with respect to the gates and ease of manufacture. The mask is removed and the structure is annealed at a temperature of between 1000° C. and 1100° C.

Figure 13:
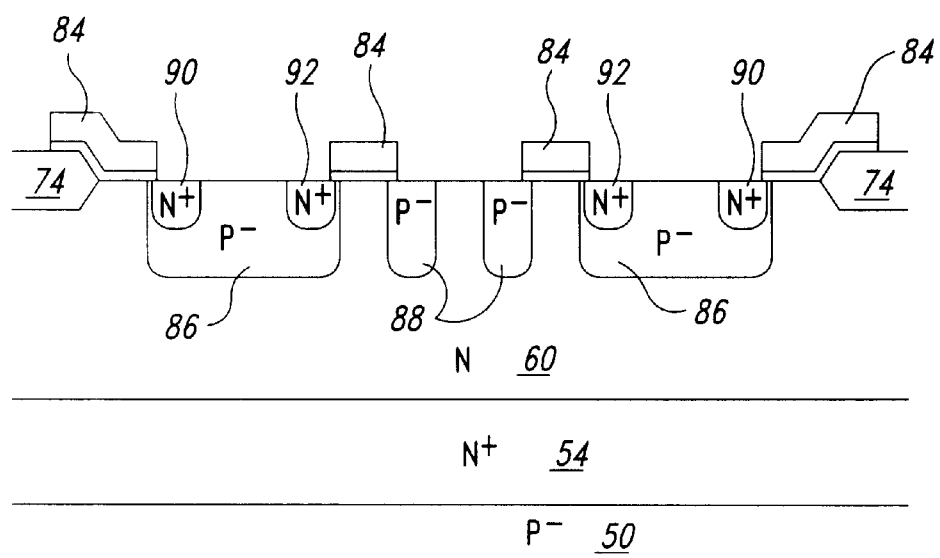
Figure 14:
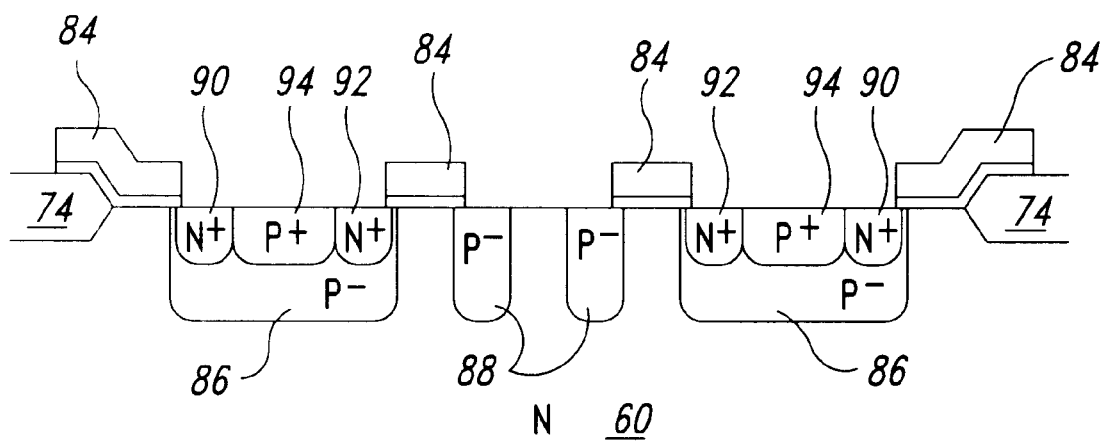

As shown in FIG. 13, a mask (not shown) is grown or deposited on the surface of the epitaxial layer 60 between the gate electrodes 84 exposing two annular regions over the P$^-$ body region 86. The exposed regions are implanted with arsenic ions at an implant energy of 60 KeV, resulting in two annular N$^+$ type source regions 90 and 92 having a dopant concentration in the range of 1–3E20 cm$^{-3}$. The N$^+$ source regions 90 and 92 are self-aligned, along one edge, to the gate electrodes 84, thus ensuring accurate placement with respect to the gate electrodes 84. With reference to FIG. 14, another mask (not shown) is grown or deposited on the surface of the epitaxial layer 60 to expose an annular region between the two N$^+$ source regions 90 and 92. The exposed region is implanted with boron ions at an implant energy of 15–25 KeV, resulting in annular P$^+$ type region 94 having a dopant concentration in the range of 5E19–1E20 cm$^{-3}$. The mask is removed and the structure is annealed at a temperature of between 900° C. and 1000° C.

Figure 15:
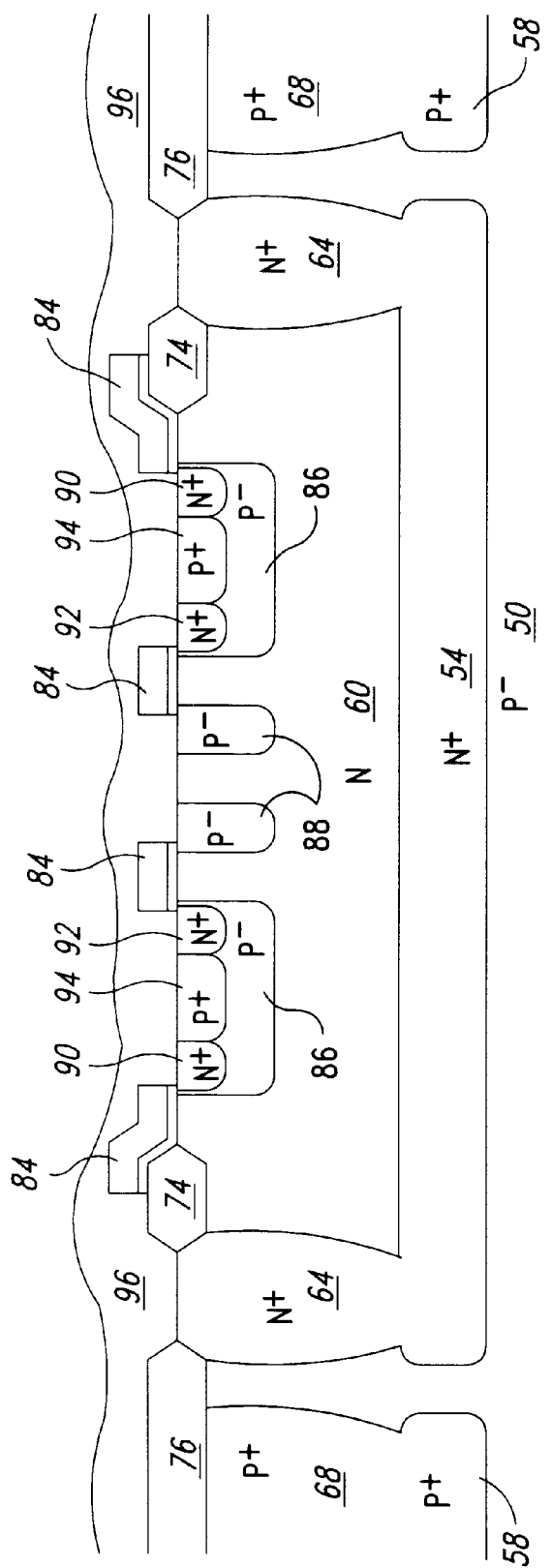

With reference to FIG. 15, a BPSG oxide layer 96 is deposited over the field oxide regions 74 and 76, the gate electrodes 84, and the surface of the epitaxial layer 60. The BPSG oxide layer 96 has a thickness of between 0.6 μm and 1.0 μm, and is heated to a temperature of between 900° C. and 1000° C. to allow the BPSG oxide layer 96 to reflow. Gate contact electrodes (not shown) are formed to establish conductive paths for the gate electrodes 84. The gate contact electrodes are preferably provided by AlSiCu deposited by physical vapor deposition (PVD) processes.

Figure 16:
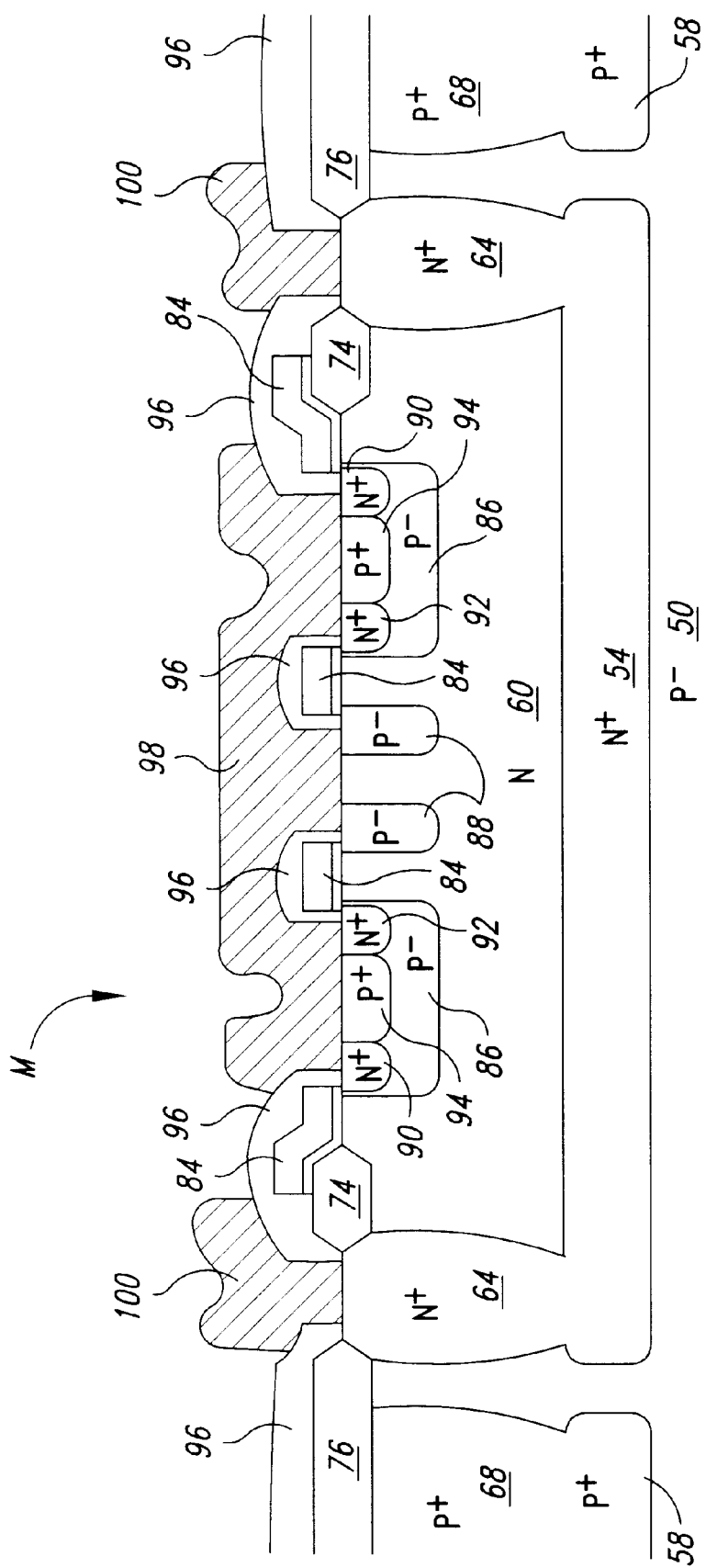

With reference to FIG. 16, openings are etched through the BPSG oxide layer 96 above the N$^+$ drain region 64, the N$^+$ source regions 90 and 92, the P$^+$ region 94, the P$^-$ ring region 88, and the epitaxial layer 60. The openings are positioned to expose a portion of the P$^-$ ring region 88 and the epitaxial layer 60, the P$^+$ region 94 and a portion of the N$^+$ source regions 90 and 92. A metallic layer 98, preferably of AlSiCu, is deposited in the openings to establish an ohmic contact between the N$^+$ source regions 90 and 92, the P$^+$ region 94, and the P$^-$ ring region 88. The gate electrodes 84 are electrically connected together by the appropriate contacts such as a conductive mesh or second level interconnects, not shown, to retain clarity and because it is well known in the art. A metallic layer 100, also preferably of AlSiCu, is deposited over the N$^+$ drain region 64 to provide an ohmic contact for the drain of the DMOS transistor. The metallic layers 98 and 100 are deposited by any suitable technique, PVD being preferred.

The final structure is shown in FIG. 16.

Figure 16A:
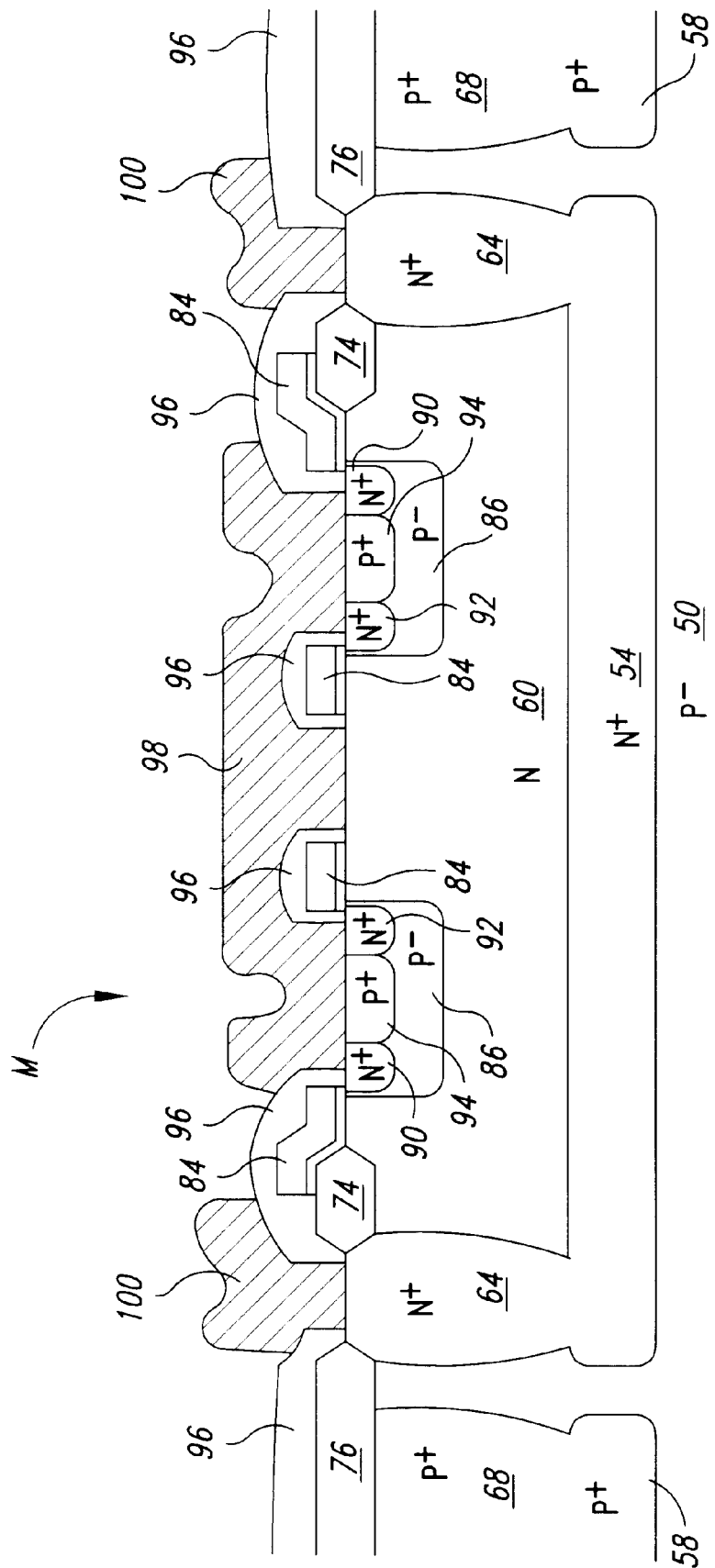
FIG. 16A is a cross-sectional view of a DMOS transistor according to an alternative embodiment of the invention.

An alternative embodiment of the invention is shown in FIG. 16A. The cross-section shown in FIG. 16A is identical to the cross-section shown in FIG. 16 with the exception that the P⁻ ring region 88 is not formed in the epitaxial layer 60. The P⁻ ring region 88 enhances the performance in some embodiments, but is not necessary in other embodiments of the invention.

Figure 17:
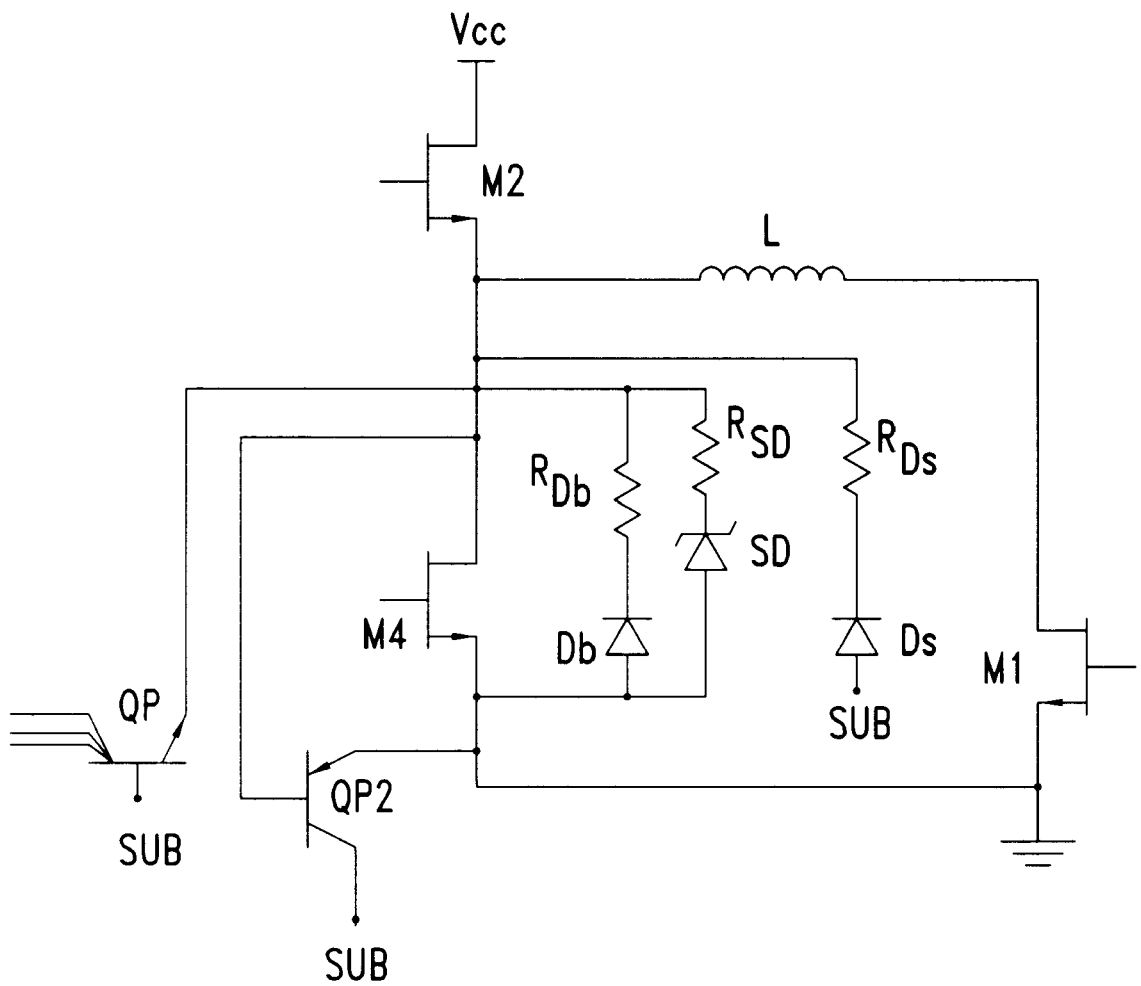
FIG. 17 is a partial electrical schematic diagram of an H-bridge circuit controlling an inductive load with a DMOS transistor according to the first embodiment of the invention.

The structure and operation of the DMOS transistor M will now be described with reference to FIGS. 17 and 18. FIG. 17 is a partial electrical schematic diagram of an H-bridge circuit controlling an inductive load. A DMOS transistor M according to the first embodiment of the invention is shown in the position of a transistor M4 though it is preferred to use the transistor M for transistors M1, M2, M3, M4 or at other locations in an integrated circuit. A drain of the transistor M4 is connected to a first end of an inductive load L, and a source of the transistor M4 is connected to a ground voltage reference. The parasitic elements are shown in schematic form in FIG. 17 and at their general representative locations in silicon in FIG. 18. A body diode Db and a Schottky diode SD are connected in parallel between the source of the transistor M4 and the drain of the transistor M4. The body diode Db has a resistance $R^{Db}$ which is shown in series. The Schottky diode SD has a resistance $R^{SD}$ which is also shown in series. A diode Ds with a series resistance $R^{DS}$ is shown connected between a substrate SUB and the drain of the transistor M4. A parasitic PNP transistor QP2 has an emitter connected to the source of the transistor M4, a collector connected to the substrate SUB, and a base connected to the drain of the transistor M4. A parasitic NPN transistor QP is shown having a set of collectors that originate in a plurality of nearby N type epitaxial regions on the same integrated circuit, a base connected to the substrate SUB, and an emitter connected to the drain of the transistor M4.

Figure 18:
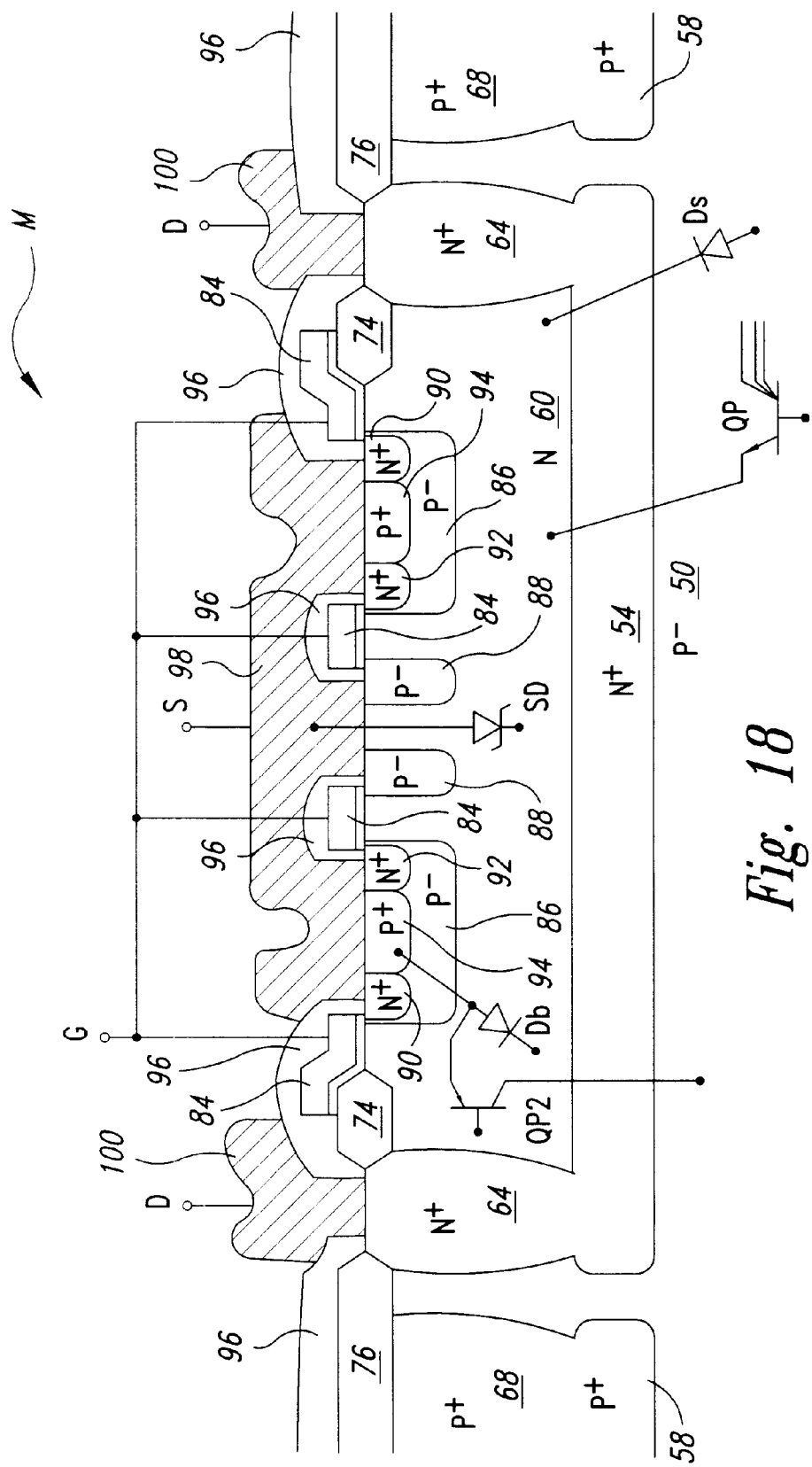
FIG. 18 is a cross-sectional view of the DMOS transistor of FIG. 16 including parasitic elements according to the first embodiment of the invention.

A cross-sectional view of a DMOS transistor according to the first embodiment of the invention is shown in FIG. 18. Similar elements and regions from FIGS. 16, 16A and 17 are given the same reference numerals. Representative examples of the parasitic elements of FIG. 17 are shown in their general locations. The gate electrodes 84 are connected by a gate terminal G, as is well known in the art. The N⁺ drain region 64 has an ohmic connection with a drain terminal D through the layer 100. A body diode Db is shown between the P⁺ region 94, which is in ohmic contact with a source terminal S through the metallic layer 98, and the epitaxial layer 60. A substrate diode Ds is shown between the P⁻ substrate 50 and the epitaxial layer 60. A Schottky diode SD is shown between the metallic layer 98 and the epitaxial layer 60. The P⁻ ring 88 may or may not be present, according to a desired design.

The contact between the metallic layer 98 and the epitaxial region 60 is a rectifying contact providing the Schottky diode SD structure. A parasitic PNP transistor QP2 is shown having an emitter in the source terminal S through the P⁺ region 94, a base in the epitaxial layer 60, and a collector in the P⁻ substrate 50. A parasitic NPN transistor QP is shown having a plurality of collectors originating at various localized N type epitaxial wells, a base in the P⁻ substrate 50, and an emitter in the epitaxial layer 60 of the DMOS transistor.

The operation of the DMOS transistor according to the first embodiment of the invention will now be described. The DMOS transistor is switched on by applying a positive voltage to the gate terminal G. An N type channel is created in the P⁻ body region 86 to conduct current between the N⁺ source regions 90 and 92 and the N⁺ drain region 64. The N⁺ drain region 64 is in ohmic contact with the drain terminal D. The N⁺ source regions 90 and 92 are usually connected to a ground voltage reference through an ohmic contact with the source terminal S.

When the DMOS transistor is driving an inductive load, the drain terminal D may be connected to the inductive load. A power supply to the inductive load may suddenly change, as described above, and the inductive load may, as a result, attempt to draw current through the DMOS transistor by reducing the voltage at the drain terminal D below the ground voltage reference at the source terminal S which could result in the below ground effect described above. The inductive load therefore attempts to draw current from the ground voltage reference through the source terminal S, the DMOS transistor structure, and the drain terminal D. In an ideal DMOS transistor according to the invention, the rectifying contact between the metallic layer 98 and the epitaxial region 60 forms the Schottky diode SD with a forward bias voltage drop of 0.3 volts. In comparison, the ideal body diode Db has a forward bias voltage drop of 0.7 volts. In one embodiment of the DMOS transistor according to the invention, the Schottky diode SD is constructed with a titanium alloy and is likely to have a forward bias voltage drop in the general range of 0.56–0.6 volts and the body diode Db will likely have a forward bias voltage drop in the range of 0.9–1.1 volts. In other embodiments, such as those in which other metals or different doping concentrations are used for the various junctions and diodes, the range may be much higher or lower, as selected by a designer. For example, aluminum alloys, tungsten alloys, or the like could be used for the Schottky diode SD and the doping concentrations in the silicon could be varied.

When the voltage of the drain terminal D is driven below the ground voltage reference most of the recirculation current is passed through the Schottky diode SD, and none or only a small amount of the recirculation current can pass through the body diode Db if the Schottky diode is conducting a threshold current. The Schottky diode SD prevents the parasitic NPN transistor QP from switching on until the threshold current is reached.

Similarly, if the DMOS transistor is driving an inductive load, and the source terminal S is connected to the inductive load, the oversupply effect described above may occur if the power supply to the inductive load is suddenly changed. The presence of the Schottky diode SD diverts the recirculation current from the body diode Db and prevents the parasitic PNP transistor QP2 from switching on.

An advantage of the placement of the Schottky diode SD is that it permits a large amount of current to flow from the source terminal S to the drain terminal D without the body diode Db or the parasitic transistors QP or QP2 becoming active. In the DMOS transistors of prior art, the parasitic transistors QP and QP2 draw current any time the body diode Db is forward biased. In addition to the amount of current in the body diode Db, the rate of change of voltage across the transistor, dV/dt, also influences the response of the transistors QP and QP2. In the DMOS transistor according to the invention, the body diode Db and the parasitic transistors QP and QP2 are held off even when a large current is being drawn through the Schottky diode SD. For example, the source to drain current can be in the range of 4–6 amps or higher for this DMOS transistor in the integrated circuit and still avoid latch-up and parasitic problems in this transistor and also in the rest of the integrated circuit. The invention thus permits conducting a large operating current in a transistor on an integrated circuit without causing parasitic effects in other circuits on the same substrate. Further, the parasitic effects are avoided until a threshold current is drawn through the Schottky diode. The threshold current is determined in part by the area of the Schottky diode SD integrated into the structure of the DMOS transistor, the metals used, and other processing factors. In one embodiment, the area of the Schottky diode and metallic alloys are selected to ensure a threshold current of in excess of 4 amps, using the factors and materials described above. The body diode Db starts to draw significant current only after the Schottky diode SD is conducting well above the threshold current because the forward bias needed to switch on the body diode Db is much higher than the forward bias needed for the Schottky diode SD. The Schottky diode SD thus prevents latch-up. It also prevents turn-on of an SCR when a current from the source terminal S is less than a threshold current.

Another advantage of the DMOS transistor according to a first embodiment of the invention is the $P^-$ ring region 88 surrounding the rectifying contact between the metallic layer 98 and the epitaxial layer 60. The $P^-$ ring region 88 preferably overlaps both the gate electrode 84 and the metallic layer 98, though this is not strictly required. The $P^-$ ring region 88 increases the breakdown voltage of the Schottky diode SD by creating a deeper depletion region within the epitaxial layer 60. This has the advantage of increasing the breakdown voltage of the DMOS transistor. The Schottky diode SD may have a finite amount of leakage current, but the leakage current is inversely proportional to the potential of the rectifying contact, and a compromise may be reached between the amount of leakage current allowed and the desired contact potential. As described above, a DMOS transistor according to the invention may operate without the $P^-$ ring region 88.

As a further advantage, the metallic layer 98 overlaps both the $N^+$ source regions 90 and 92 as well as the $P^+$ region 94. This ensures that they are held at the same voltage and is a further benefit to prevent latch-up and parasitic effects.

An inventive DMOS transistor and a method for fabricating the inventive DMOS transistor have been described. The details of well known circuits such as an H-bridge circuit for controlling an inductive load have not been shown in detail in order not to unnecessarily obscure the invention. In addition, it will be appreciated that, although an embodiment of the invention has been described above for purposes of illustration, various modifications may be made without deviating from the spirit and scope of the invention. For example, the order of steps in the fabrication of the DMOS transistor may be rearranged. Also, those skilled in the art will appreciate that DMOS transistors having a different arrangement of regions could be employed according to the present invention. Numerous variations are well within the scope of this invention. Accordingly, the invention is not limited except as by the appended claims.

What is claimed is:

1. A process for manufacturing a DMOS device in an integrated circuit comprising:

forming an epitaxial layer of a first conductivity type over a substrate;

forming a deep barrier region within adjoining surface portions of the substrate and the epitaxial layer, the deep barrier region having a higher dopant concentration of the first conductivity type than the epitaxial layer;

implanting a deep drain region extending from a surface of the epitaxial layer to outer peripheral regions of the deep barrier region to define a well region within the epitaxial layer;

implanting a body region of a second conductivity type within the well region;

implanting first and second source regions of the first conductivity type at a surface of the well region and within the body region;

forming a first insulated gate above an outer portion of the first source region, the body region, and the well region;

implanting a guard ring in the well region and surrounded by the body region, the guard ring having a predetermined depth within the well region;

forming a second insulated gate above an inner central portion of the second source region, the body region, and the well region;

depositing a conductive drain contact over the deep drain region; and depositing a conductive source contact over the first and second source regions and the central surface area of the well region inside the second insulated gate.

2. The process of claim 1, further including implanting a central body region of the second conductivity type between the first and second source regions.

3. The process of claim 1, further including implanting a deep isolation region of the second conductivity type extending from the surface of the epitaxial layer to the substrate, and circumferentially spaced from and surrounding the deep barrier region and the deep drain region.

4. The process of claim 1 wherein the act of forming an epitaxial layer comprises forming an epitaxial layer of a first conductivity type on a substrate of a second conductivity type.

5. The process of claim 1, further comprising, prior to the act of forming an epitaxial layer, implanting dopants of the first conductivity type to form a heavily doped region in a region in the substrate that will become the well region, where the substrate has a second conductivity type.

6. The process of claim 1, further comprising, prior to the act of forming an epitaxial layer, implanting dopants of the second conductivity type to form first heavily doped regions outside of a region that will become the well region.

7. The process of claim 6, further comprising, after the act of forming an epitaxial layer, implanting dopants of the second conductivity type to form second heavily doped regions that are coupled to the first heavily doped regions.

8. The process of claim 4 wherein the act of forming an epitaxial layer comprises forming an n-type epitaxial layer on a p-type substrate.

9. A process for co-integrating a Schottky diode with a power DMOS transistor comprising:

implanting dopants of a first conductivity type in a first localized region of a substrate of a second conductivity type to provide a heavily doped region;

implanting dopants of the second conductivity type in a second localized region of the substrate adjacent to the first localized region to provide a heavily doped region;

growing an epitaxial layer of the first conductivity type that is less heavily doped than the first localized region on the substrate;

implanting dopants of the first conductivity type around a periphery of the first localized region to form a heavily doped drain region;

implanting dopants of the second conductivity type into a barrier region of the second conductivity type surrounding the heavily doped drain region and contacting the second localized region;

forming a body region of the second conductivity type within a well having a periphery defined by the drain region;

forming first and second source regions of the first conductivity type at a surface of the well region and within the body region;

forming first and second portions of gate electrodes above the first and second source regions, respectively, the body region and the well region;

forming a drain contact to the drain region; and forming a metallic source contact on the first and second source regions that also forms a Schottky contact to the well.

10. The process of claim 9, further comprising implanting a guard ring in the well region and surrounded by the body region, the guard ring having a predetermined depth within the well region, during the act of forming a body region.

11. A process for co-integrating a DMOS power FET and a Schottky diode comprising:

forming a well of a first conductivity type in a semiconductor wafer of a second conductivity type;

forming a body region and a guard ring of the second conductivity type within the well;

forming a metallic source contact in the body region, the source contact extending within the guard ring to form a Schottky contact to the well;

forming a drain region at a periphery of the well; and forming a gate between the source and the drain contacts.

12. The process of claim 11 wherein the act of forming a well comprises:

implanting dopants of the first conductivity type into the wafer to form a heavily doped region;

growing an epitaxial layer of the first conductivity type that is less heavily doped than the heavily doped region on the wafer; and implanting dopants of the first conductivity type into the epitaxial layer around a periphery of the heavily doped region to contact the heavily doped region.

13. The process of claim 12 wherein the act of forming a body region and a guard ring comprises implanting dopants of the second conductivity type into the well.

14. The process of claim 12, further comprising forming a barrier region of the second conductivity type surrounding the well.

* * * * *